(12) United States Patent
Mohan

(10) Patent No.: US 6,255,849 B1
(45) Date of Patent: Jul. 3, 2001

(54) ON-CHIP SELF-MODIFICATION FOR PLDS

(75) Inventor: Sundararajarao Mohan, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/498,938

(22) Filed: Feb. 4, 2000

(51) Int. Cl.[7] .............................................. H03K 19/177
(52) U.S. Cl. ................................ 326/41; 326/38; 326/39; 326/40
(58) Field of Search ........................................ 326/37–41

(56) References Cited

U.S. PATENT DOCUMENTS

| | | | |
|---|---|---|---|
| 5,646,545 | 7/1997 | Trimberger et al. ................... | 326/38 |
| 5,705,938 | 1/1998 | Kean ...................................... | 326/39 |
| 5,886,537 | * 3/1999 | Macias et al. ......................... | 326/40 |
| 6,054,871 | * 4/2000 | New ...................................... | 326/39 |
| 6,092,174 | * 7/2000 | Roussakov ............................ | 712/15 |
| 6,107,821 | * 8/2000 | Kelem et al. ......................... | 326/38 |

OTHER PUBLICATIONS

Xilinx, Inc., "The Programmable Logic Data Book", 1999, available from Xilinx, Inc., 2100 Logic Drive, San Jose, CA 95124, pp. 3–1 to 3–60.

* cited by examiner

Primary Examiner—Michael Tokar
Assistant Examiner—Vibol Tan
(74) Attorney, Agent, or Firm—Patrick T. Bever

(57) ABSTRACT

An on-chip method for self-modifying a programmable logic device (PLD) including a plurality of configurable logic blocks (CLBs), a plurality of interconnect resources for selectively connecting the CLBs, and a block memory circuit selectively connected to the interconnect resources. The CLBs are configured to implement a reconfigurable functional portion and a configuration control portion. A logic function is performed by the reconfigurable functional portion in accordance with first configuration data, while the configuration control portion monitors operation data signals transmitted to or from the reconfigurable functional portion. When the configuration control portion detects a need to modify the configuration of the reconfigurable functional portion, the configuration control portion transmits read instructions (e.g., address information) to the block memory circuit, thereby causing the block memory circuit to transmit modified configuration data to the reconfigurable functional portion, thereby performing self-modification of the PLD using only on-chip resources. In one embodiment, the configuration control portion processes the transmitted operation data received from the reconfigurable functional portion, generates the modified configuration data, and transmits the modified configuration data to the block memory circuit, where the modified configuration data is temporarily stored before transmission to the reconfigurable functional portion.

31 Claims, 9 Drawing Sheets

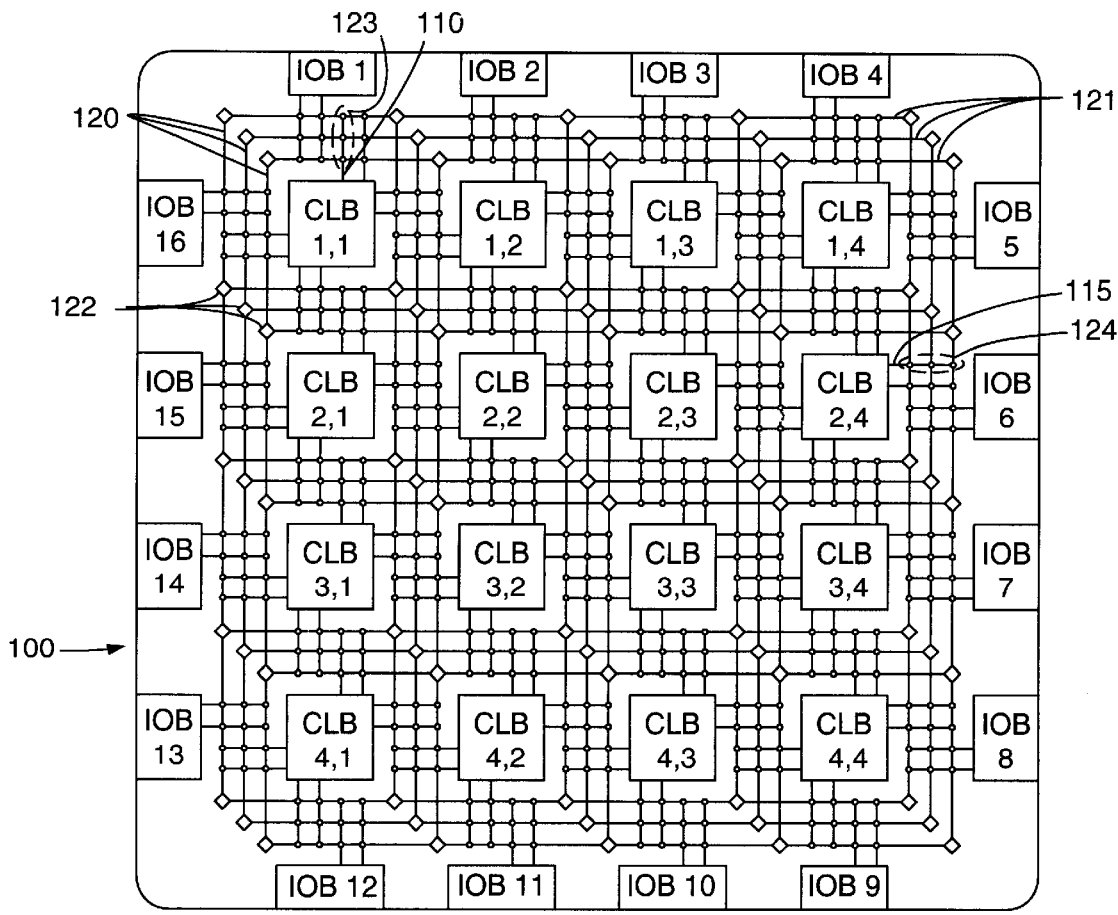
FIG. 1(A)
(PRIOR ART)
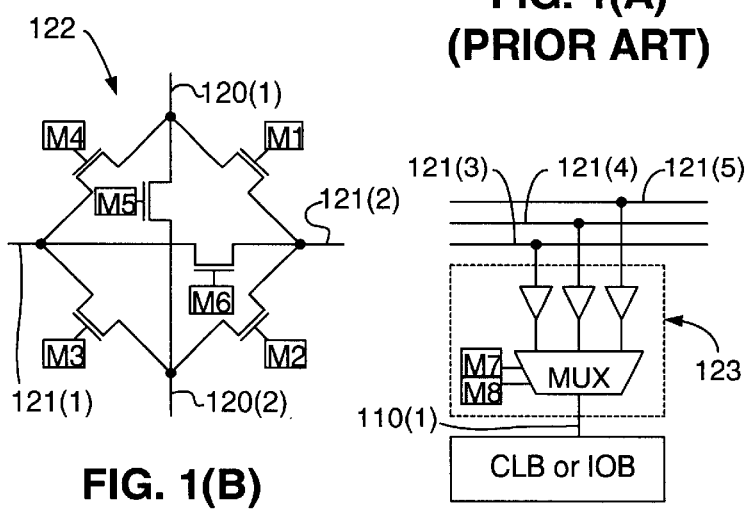
FIG. 1(B)
(PRIOR ART)
FIG. 1(C)
(PRIOR ART)
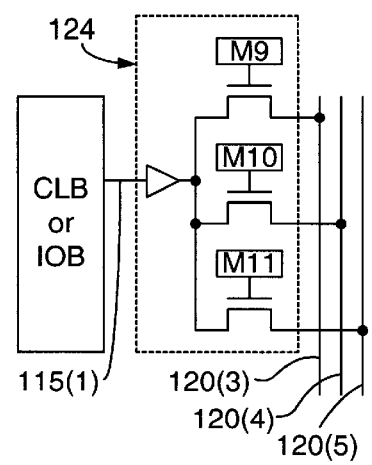
FIG. 1(D)
(PRIOR ART)

ON-CHIP SELF-MODIFICATION FOR PLDS

FIELD OF THE INVENTION

The invention relates to Programmable Logic Devices (PLDs). The invention particularly relates to a self-modification method for Field Programmable Gate Arrays (FPGAs) including Look-Up Table-based (LUT-based) logic elements.

BACKGROUND OF THE INVENTION

PLDs are general-purpose integrated circuits that typically include both user-configurable circuitry and configuration control circuitry. The configuration control circuitry typically includes a configuration memory array and addressing circuitry for writing configuration data, which is typically transmitted in a bit stream, into the configuration memory array. The user-configurable circuitry typically includes logic elements and associated interconnect resources that are connected to the memory cells of the configuration memory array, and are programmed (configured) by the configuration data stored in the configuration memory array to implement user-defined logic operations (that is, a user's circuit).

One characteristic that distinguishes early PLDs from more recent PLDs is the ability to partially reconfigure the configuration memory array. Early PLDs included relatively simple configuration control circuitry that only supported full configuration of the configuration memory array (i.e., each time a change in the configuration was needed, the entire configuration memory array was rewritten). In addition, the memory cells of the configuration memory array were only accessible through the configuration control circuitry in these early PLDs. More recent PLDs include relatively sophisticated configuration control circuitry that allows partial reconfiguration of selected portions of the configuration memory array. Further, in contrast to the early PLDs, some memory cells of the configuration memory circuit in these more recent PLDs can be rewritten with data transmitted over the interconnect resources of the user-configurable circuitry.

The above-mentioned differences and other differences between early and recent conventional PLDs are explained in additional detail in the following sections.

Early FPGAs

FIG. 1(A) is a simplified diagram showing the user-configurable circuitry of an early FPGA 100, which is a type of PLD. The configuration control circuitry of FPGA 100 is omitted from FIG. 1(A) for clarity.

Referring to FIG. 1(A), the user-configurable circuitry of FPGA 100 includes an array of configurable logic blocks (CLBs) CLB 1,1 through CLB 4,4 surrounded by input/output blocks (IOBs) IOB 1 through IOB 16, and programmable interconnect resources that include vertical interconnect segments 120 and horizontal interconnect segments 121 extending between the rows and columns of CLBs and IOBs. Each CLB includes configurable combinational circuitry and optional output registers programmed to implement a portion of a user-defined logic operation. The interconnect segments of the programmable interconnect resources are configured using various switches to generate signal paths between the CLBs that link the logic function portions. Each IOB is similarly configured to selectively utilize an associated pin (not shown) of FPGA 100 either as a device input pin, a device output pin, or an input/output pin. The combinational circuitry of each CLB, the switches of the interconnect resources, and the configurable elements of the IOBs are all controlled by configuration data stored in configuration memory cells (not shown) that are controlled by the configuration control circuitry.

FIGS. 1(B) through 1(D) are simplified diagrams showing examples of the various switches associated with the programmable interconnect resources utilized in the user-configurable circuitry of FPGA 100. As mentioned above, each switch is controlled by one or more configuration memory cells that store configuration data transmitted through the configuration control circuit (discussed above). FIG. 1(B) shows an example of a six-way segment-to-segment switch 122 that selectively connects vertical wiring segments 120(1) and 120(2) and horizontal wiring segments 121(1) and 121(2) in accordance with configuration data stored in configuration memory cells M1 through M6. Alternatively, if horizontal and vertical wiring segments 120 and 121 do not break at an intersection, a single transistor makes the connection. FIG. 1(C) shows an example of a segment-to-CLB/IOB input switch 123 that selectively connects an input wire 110(1) of a CLB (or IOB) to one or more interconnect wiring segments in accordance with configuration data stored in configuration memory cells M7 and M8. FIG. 1(D) shows an example of a CLB/IOB-to-segment output switch 124 that selectively connects an output wire 115(1) of a CLB (or IOB) to one or more interconnect wiring segments in accordance with configuration data stored in configuration memory cells M9 through M11.

FIG. 1(E) is a diagram showing simplified configuration control circuitry 130 of FPGA 100. Configuration control circuitry 130 typically includes an array of configuration memory cells (M0,0 through M15,15), and a control circuit for writing configuration data into the array of configuration memory cells. The array of configuration memory cells includes columns (frames) that are accessed by the control circuit, which includes a data shift register DSR and an address shift register ASR. To load configuration data into the configuration memory cells, an externally-generated bit stream including the configuration data is serially shifted into the data shift register DSR under control of a clocking mechanism until a frame of data is stored in data shift register DSR. This frame of data is then shifted in parallel into a column (frame) of configuration memory cells addressed by address shift register ASR. This process of serial shifting frames of configuration data from the bit stream and parallel shifting the frames into associated columns of configuration memory cells is repeated for all columns (frames) of the PLD.

FIG. 1(F) is a simplified circuit diagram showing memory cell M0,0 of the array of configuration memory cells shown in FIG. 1(E). Memory cell M0,0 includes a latch formed by inverters I1 and I2 that stores a bit value transmitted through a pass transistor T1. During configuration, when the token high bit is shifted into address shift register bit AS0 (FIG. 1(E)), the resulting high signal on line A0 is applied to the gate of pass transistor T1, thereby allowing the configuration bit stored in data shift register bit position DS0 to enter the latch via data line D0. The value stored in memory cell M0,0 is then applied via output line Q and/or Q-bar (QB) to control a corresponding configurable logic block or configurable routing resource, such as the switching structures shown in FIGS. 1(B) through 1(D).

Advanced FPGAs

While early FPGAs (such as FPGA 100, discussed above) provided significant advantages over other early PLD types, several features have been incorporated into advanced FPGAs that have provided further advantages. One such feature is the ability to program (reconfigure) at least some of the configuration memory cells through the interconnect resources, thereby allowing a user to modify the logic function performed by an advanced FPGA while the FPGA is operating. Another feature is the ability to reconfigure a portion of an advanced FPGA through the configuration control circuit. Yet another feature of some advanced FPGAs is the ability to perform full and partial reconfiguration via a standard JTAG (Boundary Scan) interface circuitry.

FIG. 2(A) is a split-level perspective view showing a simplified representation of an advanced FPGA 200, which is consistent with the Virtex™ family of FPGAs produced by Xilinx, Inc. of San Jose, Calif.

Similar to most integrated circuits, FPGA 200 includes programmable circuitry formed on a semiconductor substrate that is housed in a package having externally accessible pins. However, to simplify the following description, FPGA 200 is functionally separated into a configuration plane 220 and a logic plane 250. Other simplifications and functional representations are utilized to facilitate the following description. For additional detail regarding Virtex FPGAs, the reader is referred to the Xilinx Programmable Logic Data Book 1999, pages 3-1 through 3-60, which are incorporated herein by reference.

Configuration plane 220 generally includes a configuration control circuit (CONFIG CKT) 222 that is located between two halves of a configuration memory array 225. Configuration circuit 222 includes several input and/or output terminals that are connected to dedicated configuration pins 227 and to dual-purpose input/output (I/O) pins 228. Configuration memory array 225 includes configuration memory cells 226-1 and 226-2 that are arranged in "frames" (i.e., columns of memory cells extending the length of FPGA 200), and addressing circuitry (not shown) for accessing each frame. JTAG (Boundary Scan) circuitry 230 is included in configuration plane 220, and is also connected to at least one terminal of configuration circuit 222. JTAG circuit 230 includes the four well-known JTAG terminals 233 (i.e., TDI, TDO, TMS, and TCK). During configuration of FPGA 200, configuration control signals are transmitted from dedicated configuration pins 227 to configuration circuit 222. In addition, a configuration bit stream is transmitted from either the TDI terminal of JTAG circuit 230, or from dual-purpose I/O pins 228 to configuration circuit 222. During a configuration operation, configuration circuit 222 routes configuration data from the bit stream to memory array 225 to configure FPGA 200. Configuration circuit 222 is described in additional detail below.

User-programmable logic plane 250 includes CLBs arranged in rows and columns, IOBs surrounding the CLBs, and programmable interconnect resources including interconnect lines 252 (indicated by heavy black lines) and multi-way switch boxes 253 (indicated by rectangles) that are connected between the rows and columns of CLBs. During normal operation of FPGA 200, logic signals are transmitted from dual-purpose pins 228 and/or device I/O pins 255 through the IOBs to the interconnect resources, which route these signals to the CLBs in accordance with the configuration data stored in memory array 225. The CLBs perform logic operations on these signals in accordance with the configuration data stored in memory array 225, and transmit the results of these logic operations to dual-purpose pins 228 and/or device I/O pins 255. In addition to the CLBs, programmable logic plane 250 includes dedicated random-access memory blocks (BLOCK RAM) that are selectively accessed through the IOBs and interconnect resources. Other programmable logic plane resources, such as clock resources, are omitted from FIG. 2(A) for brevity.

FIGS. 2(B) and 2(C) are simplified circuit diagrams illustrating the two types of memory cells utilized in FPGA 200: single-access memory cells 226-1 (FIG. 2(B)), and dual-access memory cells 226-2 (FIG. 2(C)). Similar to memory cell M0,0 of early FPGA 100 (see FIG. 1(F)), single-access memory cells 226-1 are only accessible through configuration plane 220, while dual-access memory cells 226-2 are accessible through both configuration plane 220 and logic plane 250.

Referring to FIG. 2(B), memory cell 226-1 includes a latch formed by inverters I1 and I2 that can only be programmed with data transmitted on configuration data line DX via transistor T1, which is controlled by a configuration address signal transmitted on configuration address line Ax. The values stored in memory cells 226-1 are used to control portions of FPGA 200 that typically do not change during normal (logic) operation. For example, as indicated by the single-headed dashed-line arrows in FIG. 2(A), memory cells 226-1 are used to control the IOBs and the interconnect resources to form signal routing paths between selected CLBs. After memory cells 226-1 are set during initial configuration, they may only be changed or otherwise accessed (i.e., read or written) through configuration circuit 222 during readback or reconfiguration operations.

Referring to FIG. 2(C), each dual-access memory cell 226-2 includes a latch that can be programmed with data transmitted through either configuration plane 220 or logic plane 250. Similar to single-access memory cells 226-1, dual-access memory cell 226-2 is programmed during the configuration mode using data received on configuration data line DX via transistor T1, which is turned on by configuration address line AX. During normal operation, dual-access memory cell 226-2 may be reprogrammed with data received at terminal DY via transistor T2, which is controlled by an address signal received at terminal AY. These normal operation data signals and address signals are received from the interconnect resources of FPGA 200 in accordance with a user's logic operation. The values stored in dual-access memory cells 226-2 are used to control portions of FPGA 200 that may change during normal (logic) operation, such as the lookup table data in the CLBs and memory data in the Block RAMs. As indicated by the dual-headed dashed-line arrows in FIG. 2(A), after memory cells 226-2 are set during initial configuration, they may be changed or otherwise accessed (i.e., read or written) through the interconnect resources of logic plane 250, and they may be read back or reconfigured via configuration plane 220 (as discussed below).

Conventional Self-Modification Methods

A self-modifying system is an electronic system that is capable of modifying its internal circuitry in response to changes in external conditions. An example of such a self-modifying system is an adaptive filter that changes its filtering characteristics in accordance with changes in the input signals supplied to the filter. Some self-modifying systems include a reconfigurable functional portion that performs system logic functions in accordance with stored configuration data, and a configuration control circuit that is able to change the stored configuration data in response to operating environment changes. The reconfigurable functional portion and at least a portion of the configuration control circuit are often implemented by a PLD.

As suggested above, self-modification systems that include early PLDs, such as FPGA 100 (described above), require complete reconfiguration of the PLD each time self-modification is needed. Therefore, these self-modification systems necessarily needed both control and configuration storage devices located outside of the PLD in order to reconfigure the PLD whenever necessary. A problem with this conventional self-modification method is that operation of the system must be suspended during reconfiguration. Another problem is that the statistical probability of configuration error increases with the amount of configuration data transmitted to the PLD. In other words, because it is not possible to partially reconfigure early PLDs, the potential for configuration error is maximized.

Self-modification systems that include advanced PLDs, such as FPGA 200 (described above), avoid some of the problems associated with systems using early PLDs. For example, because the advanced PLDs can be partially reconfigured, the potential for configuration error is reduced.

Several self-modification methods have been developed for systems including advanced PLDs such as FPGA 200 (discussed above). One such method utilizes the JTAG-to-configuration control circuit interface (discussed above with reference to FPGA 200) to allow configuration data to be downloaded from an external source into the PLD. The downloaded configuration data is then used to partially or fully reconfigure the PLD. A problem with this method is that significant time is required to establish a connection between the PLD and external source, and then download the configuration data. Therefore, remote reconfiguration may not be feasible in systems that require frequent modification. In addition, remote reconfiguration typically requires configuration control (e.g., communication hardware/software) that is partially located outside of the PLD.

U.S. Pat. No. 5,646,545 discloses another self-modification method for a time-multiplexed FPGA architecture that includes special hardware for storing multiple configuration sets. The method involves pre-loading the multiple configuration sets, and then instantaneously switching between the configuration sets on demand to control the user logic portion of the FPGA. A problem with this self-modification method is that the special time-multiplexing circuitry, which is required to implement the method, takes up a significant amount of die space, thereby reducing the space available for CLBs and other logic resources in the user plane of the FPGA.

U.S. Pat. No. 5,705,938 discloses another special PLD architecture in which a user logic portion is configured using configuration data transmitted through a programmable switch circuit to a memory bank located on the PLD. The programmable switch allows a single memory interface port to be controlled either by logic performed in the user plane, or by external logic that is applied to the device I/O pins of the PLD. However, this programmable switch hardware only allows logic to be read or written to the memory bank one word at a time. Further, this PLD architecture does not support direct memory-to-memory data transfers—that is, data has to be read out of the memory bank into various flip-flops provided in the user logic portion, and then written back into the memory block via the programmable switch circuit, possibly into different memory locations. Therefore, large scale reconfiguration of a PLD incorporating this architecture is likely to be unacceptably slow.

What is needed is an on-chip self-modification method for PLDs that overcomes the problems of the prior art methods described above by performing the entire self-modification process in the user-programmable logic portion of the PLD.

SUMMARY OF THE INVENTION

The present invention is directed to a self-modification method for advanced PLDs in which the entire self-modification process is performed in the user-programmable logic plane of the PLD (i.e., without accessing configuration plane resources), thereby allowing a user to produce a self-modifying circuit that does not require external control circuits or bit streams, and that is entirely designed using the programming software developed for the advanced PLD. The novel method is entirely performed on such commercially available PLDs, and does not need any additional hardware or software to support the self-modification process.

In accordance with a first embodiment of the present invention, the self-modification method of the present invention is implemented in a commercially-available FPGA having a user-programmable logic plane that includes both configurable logic blocks (CLBs) and random-access memory (block RAM) circuits that are connectable by user-programmable routing resources. The CLBs are divided into a reconfigurable functional portion and a user level configuration control portion that are connected to each other and to the block RAM circuit by routing paths established in the programmable routing resources. During operation, the logic functions performed by the reconfigurable functional portion are monitored by the user level configuration control portion. When the user level configuration control portion detects a need for modification of the reconfigurable functional portion, the user level configuration control portion transmits read address signals to the block RAM, which is used to store configuration data. In response to the read address signals, configuration data read from selected memory cells of the block RAM circuit is transmitted to the configurable function portion, whereby the reconfigurable functional portion is reconfigured using the configuration data. Because the reconfigurable functional portion, the configuration control portion, and the block RAM circuit are located in the user-programmable logic portion of the PLD, self-modification is entirely performed using on-chip resources, thereby avoiding delays associated with remote reconfiguration methods. In addition, because one block RAM circuit can be selectively connected to any logic element in the reconfigurable functional portion, the present invention requires significantly less die space to support reconfiguration than time-multiplexed FPGA architectures. Further, because reconfiguration is performed on-chip, no I/O resources are required, thereby maximizing the number of I/O resources that can be used for transmitting operation data signals to and from the reconfigurable functional portion.

In accordance with a second embodiment of the present invention, the configuration control circuit generates and stores the new configuration data in the block RAM before transmitting the new configuration data to the reconfigurable functional portion during the reconfiguration process.

In accordance with another aspect of the present invention, the user-programmable interconnect resources are configured at power-up to provide signals paths for all signal transmissions during operation of the PLD. Specifically, during initialization of the PLD, the user-programmable routing resources are programmed to establish first signal paths between the reconfigurable functional portion and the configuration control portion (i.e., for monitoring functions), second signal paths between the configuration control portion and the block RAM circuit (i.e., for transmitting configuration data and/or address signals), and third signal paths between the block RAM circuit and the reconfigurable functional portion (i.e., for transmitting new configuration data). The first, second, and third signal paths are maintained during all operations of the PLD (i.e., the memory cells controlling the routing resources are not reconfigured). Because all signal connections are on-chip and provided by the user-programmable interconnect resources, the special programming tools and/or software required in prior art self-modification schemes are unnecessary.

BRIEF DESCRIPTION OF THE DRAWINGS

FIG. 1(A) is a simplified diagram showing a portion of an early conventional FPGA.

FIGS. 1(B), 1(C), and 1(D) are diagrams showing switch circuits utilized to route signals in the FPGA of FIG. 1(A).

DETAILED DESCRIPTION OF THE DRAWINGS

The present invention is directed to a configuration architecture for programmable logic devices (PLDs), and is described with reference to advanced field programmable gate arrays (FPGAs), such as the Virtex™ family of FPGAs produced by Xilinx, Inc., of San Jose, Calif. Although the circuit structures and layout arrangements of the present invention are described below with particular reference to those provided by Virtex FPGAs, some or all of the various aspects of the present invention may be beneficially utilized in other FPGAs and other types of PLDs having resources similar to those provided in Virtex FPGAs. Therefore, the appended claims should not necessarily be limited to Virtex FPGAs.

In accordance with one aspect, the self-modification method of the present invention is performed entirely in the user-programmable logic plane of a PLD, and does not require transmission of configuration data through the configuration plane of the PLD. As used herein, the term "user-programmable logic plane" refers to general-purpose circuitry of a PLD that is controlled by configuration data to perform user-defined logic functions. A user is able to control the logic function performed by the general-purpose circuitry of the "user-programmable logic plane" by changing (reconfiguring) the configuration memory of the PLD. An example of such general-purpose circuitry is the CLBs, IOBs, block RAM, and interconnect resources of FPGA 200, which are described above with reference to FIG. 2(A). In contrast, the term "configuration plane" refers to special-purpose circuitry of a PLD that is utilized to access the configuration memory of the PLD. Operations performed by the special-purpose circuitry of the "configuration plane" are pre-defined by the PLD manufacturer. Although these operations can be initiated by the user (i.e., during remote reconfiguration procedures), the user cannot modify the circuitry performing the operations. Referring again to FIG. 2(A), an example of the special-purpose circuitry is the configuration control circuit and JTAG interface circuit of FPGA 200. By performing the self-modification process entirely in the user-programmable logic plane of a PLD, the present invention avoids the need for external connections and special programming commands and structures that are required in conventional methods, thereby greatly simplifying the resulting structure and providing increased design flexibility to the user.

First Embodiment

Figure 1E:
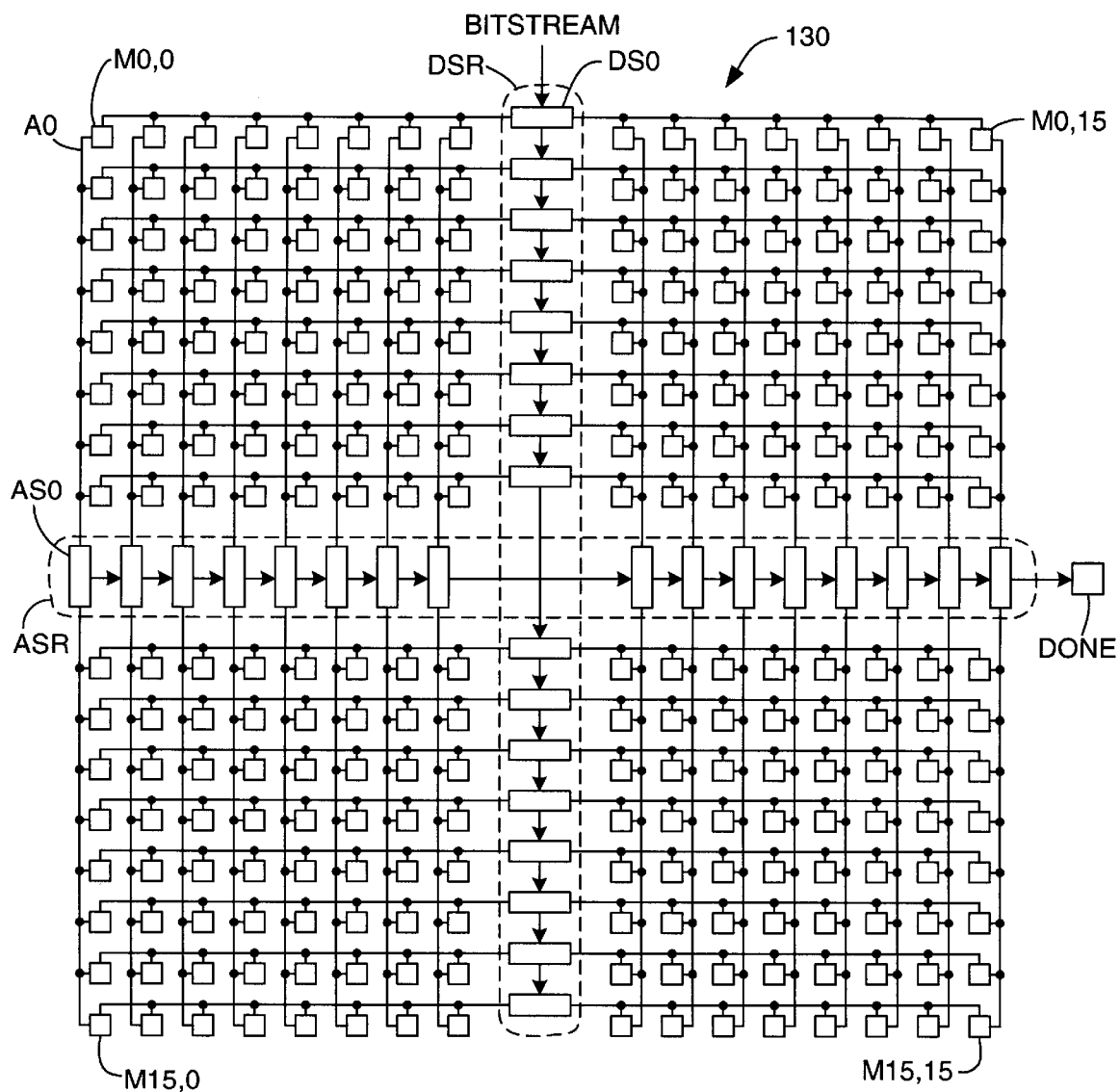
FIGS. 1(E) and 1(F) are diagrams showing a configuration memory array and configuration memory cell utilized in the FPGA of FIG. 1(A).
Figure 1F:
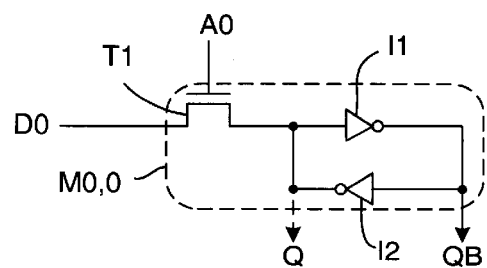
Figure 2A:
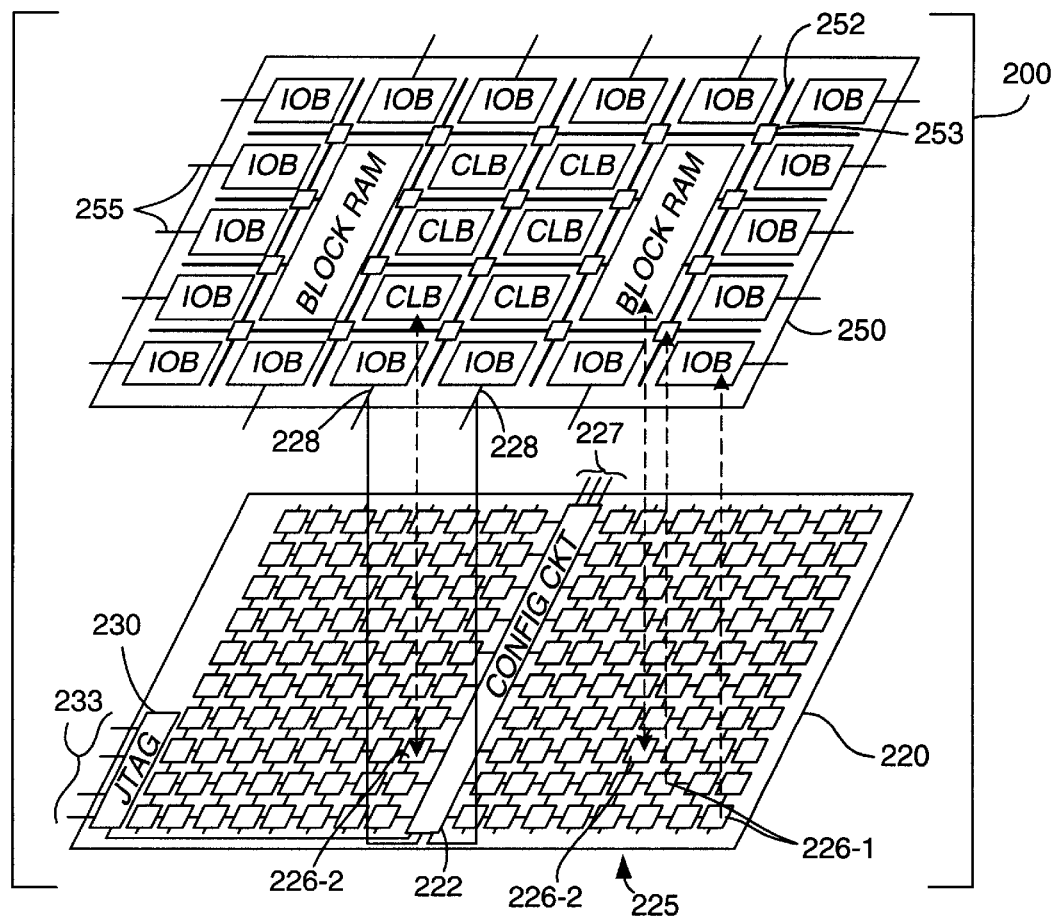
FIG. 2(A) is a simplified diagram illustrating an advanced conventional FPGA that is functionally separated into a logic plane and a configuration plane.
Figure 2B:
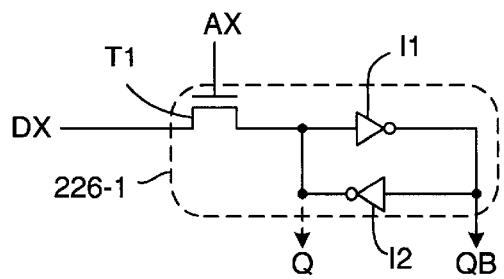
FIGS. 2(B) and 2(C) are simplified circuit diagrams showing configuration memory cells utilized in the configuration plane of the FPGA shown in FIG. 2(A).
Figure 2C:
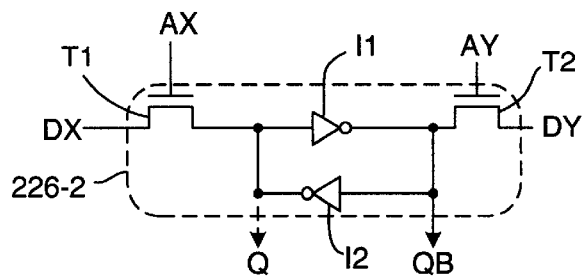
Figure 3:
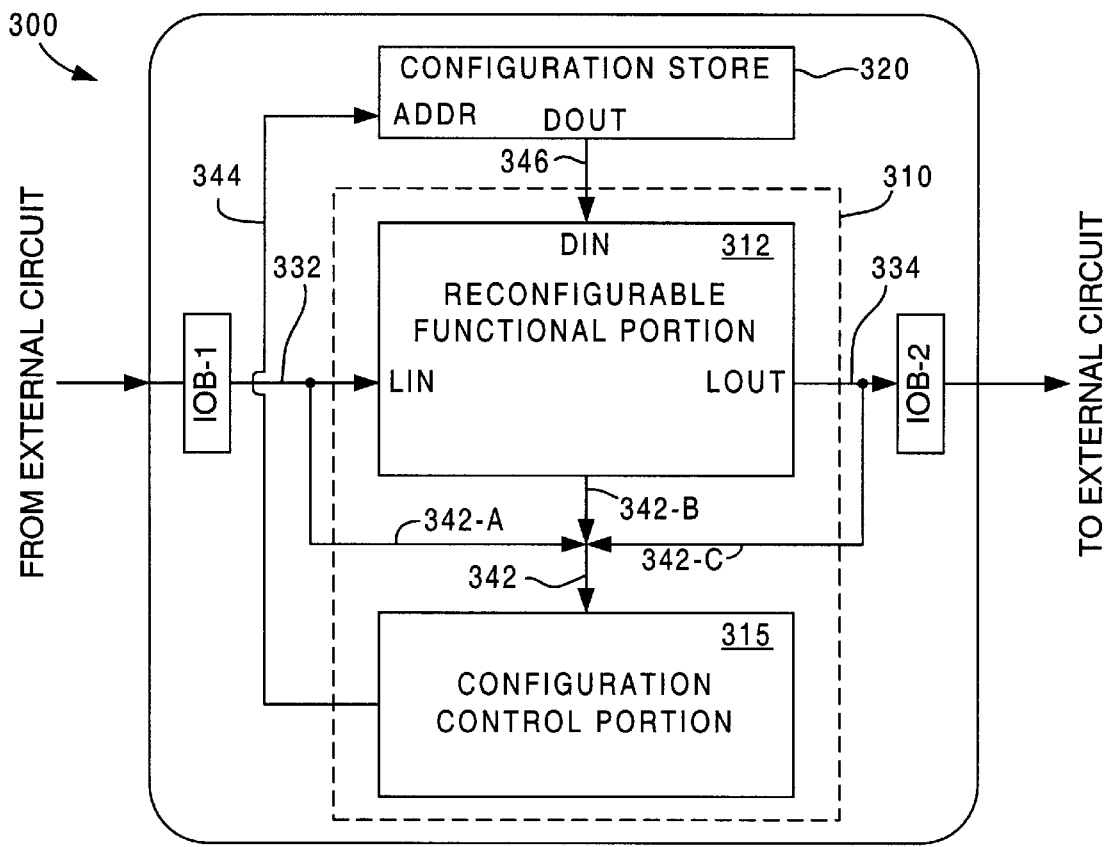
FIG. 3 is a simplified diagram illustrating a first configuration of user logic resources and interconnect (routing) resources of the FPGA shown in FIG. 2(A).

FIG. 3 is a simplified diagram illustrating the user-programmable logic portion of a PLD 300 that is configured to implement a self-modifying circuit in accordance with the present invention. PLD 300 is formed on a single substrate, and includes a CLB array 310, a configuration store (memory circuit) 320, IOB-1, IOB-2, and a system of user-programmable interconnect resources for providing signal paths between selected CLBs of array 310, configuration store 320, IOB-1, and IOB-2. In one embodiment, PLD 300 is implemented by advanced FPGA 200, described above and shown in FIG. 2(A). Referring to FIG. 2(A), CLB array 310 is formed by the CLBs of FPGA 200, configuration store 320 is implemented by the block RAM circuit of FPGA 200, IOB-1 and IOB-2 are implemented by two of the IOBs of FPGA 200, and the various signal paths of PLD 300 are implemented by interconnect lines 252 and multi-way switch boxes 253 of FPGA 200. PLD 300 also includes a configuration plane (not shown) that is used to generate the configuration shown in FIG. 3. Referring again to FIG. 2(A), according to one embodiment, the configuration plane of PLD 300 is implemented by configuration plane 220 of FPGA 200.

In accordance with the present invention, CLB array 310 is configured to implement a reconfigurable functional portion 312 and a configuration control portion 315.

Reconfigurable functional portion 312 is initially configured with initial (first) configuration data that is loaded into PLD 300 through the configuration plane (such as JTAG circuitry 230 and/or configuration circuit 222; see FIG. 2(A)) during an initial configuration process. In accordance with the initial configuration data, reconfigurable functional portion 310 performs an initial user-defined logic function that operates on input signals received, for example from IOB-1 on an input data signal path 332, and generates output signals that are transmitted on an output data signal path 334 to IOB-2.

Configuration control portion 315 monitors operation data signals received from reconfigurable functional portion 312 on signal path 342, and generates address signals and other command signals on signal paths 344. As indicated in FIG. 3, the operation data signals monitored by configuration control portion 315 may be input data signals received on optional signal path 342-A, internally-generated signals transmitted from intermediate portions of reconfigurable functional portion 312 on optional signal path 342-B, or output data signals received on optional signal path 342-C.

Configuration store 320 stores configuration data that is used to reconfigure (modify) reconfigurable functional portion 312. Configuration store 320 is connected by signal paths 344 to receive address signals and other command signals from configuration control portion 320. Configuration data read from configuration store 320 is transmitted to reconfigurable functional portion 312 on signal path 346.

Figure 4:
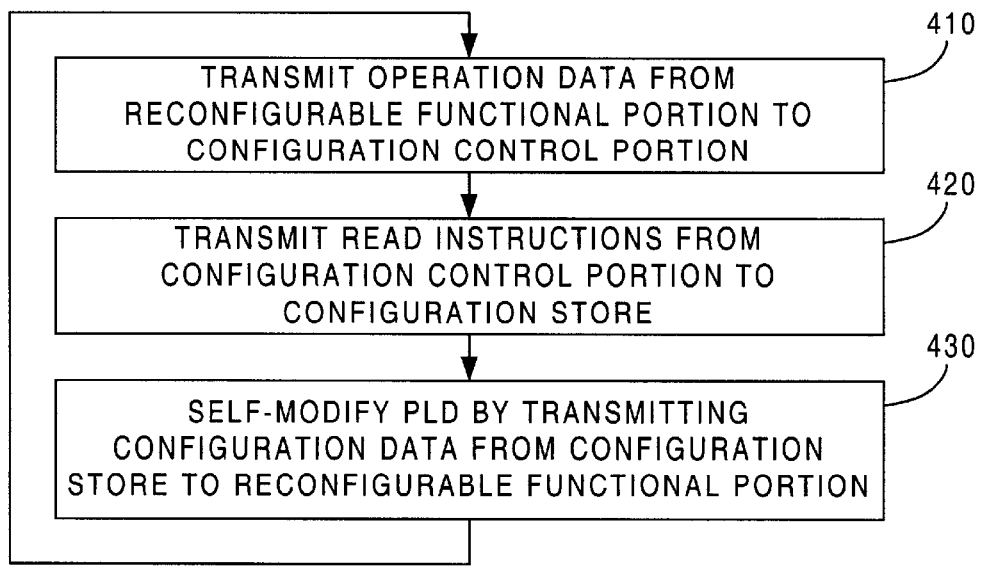
FIG. 4 is a flow diagram showing a method of operating the FPGA shown in FIG. 3 in accordance with a first embodiment of the present invention.

FIG. 4 is a flow diagram showing the basic steps utilized to perform the self-modification method according to a first embodiment of the present invention. The self-modification method is performed after the initial configuration, described above, that implements reconfigurable functional portion 312, configuration control portion 315, and the various signal paths shown in FIG. 3. Further, the method steps shown in FIG. 4 assume that alternative (new) configuration data is pre-stored in configuration store 320.

During the self-modification process, operation data signals transmitted from reconfigurable functional portion 312 on signal path 342 are monitored by configuration control portion 315 (Step 410). In accordance with the initial configuration data, configuration control portion 315 analyzes the received signals, and initiates a reconfiguration process when the received signals indicate the need for modification of reconfigurable functional portion 312. This reconfiguration process is initiated when configuration control portion 315 transmits read instructions (i.e., address signals and other read command signals) on signal paths 344 to configuration store 320 (Step 420). In particular, the read instructions address selected configuration data stored in selected memory cells of configuration store 320, thereby causing the selected configuration data to be transmitted on signal path 346. The selected configuration data is transmitted to reconfigurable functional portion 312, and overwrites at least a portion of the initial configuration data that was previously written into the configuration memory array (not shown) of PLD 300 during the initial configuration process, thereby reconfiguring (modifying) the reconfigurable functional portion to perform a modified (secondary) logic function in accordance with the selected configuration data (Step 430). Accordingly, the entire self-modification process is performed in the user-programmable logic portion of PLD 300 (i.e., without accessing the configuration plane), and is performed without utilizing any of the I/O circuits of PLD 300.

Second Embodiment

Figure 5:
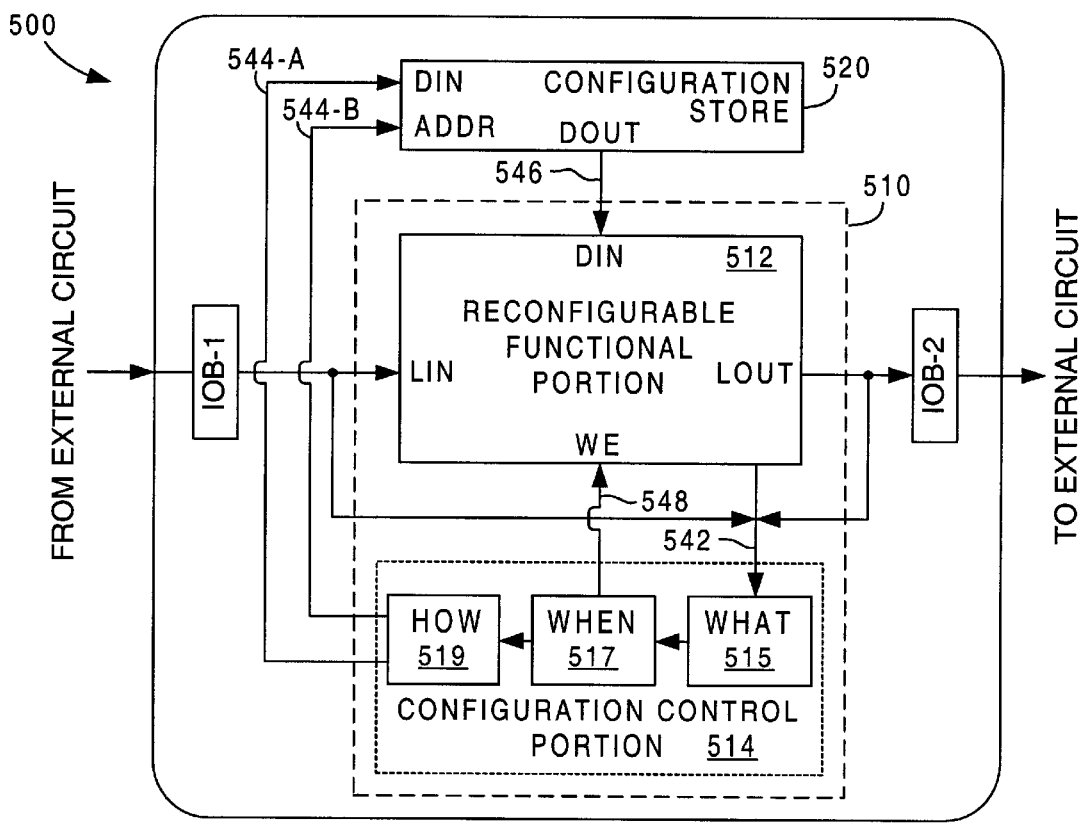
FIG. 5 is a simplified diagram illustrating a second configuration of user logic resources and interconnect resources of the FPGA shown in FIG. 2(A).

FIG. 5 is a simplified diagram illustrating the user-programmable logic portion of a PLD 500 that is configured to implement a self-modifying circuit in accordance with a second embodiment of the present invention. Similar to PLD 300 (discussed above), PLD 500 includes a CLB array 510, a configuration store (memory circuit) 520, IOB-1, IOB-2, and a system of user-programmable interconnect resources for providing signal paths between selected CLBs of array 510, configuration store 520, IOB-1, and IOB-2. In one embodiment, PLD 500 is implemented by advanced FPGA 200, described above and shown in FIG. 2(A).

CLB array 510 and configuration store 520 are used in a manner similar to CLB 300 (discussed above). Reconfigurable functional portion 512 is initially configured with initial (first) configuration data that is loaded into PLD 500 through the configuration plane (not shown). CLB array 510 is configured to implement a reconfigurable functional portion 512 and a configuration control portion 514. Configuration store 520 stores configuration data that is used to reconfigure (modify) reconfigurable functional portion 512. In accordance with the second embodiment, configuration control portion 514 is separated into a monitor (WHAT) portion 515, a scheduling (WHEN) portion 517, and an execution (HOW) portion 519. Monitor portion 515 receives operation data signals on signal path 542, and generates control signals that are passed to scheduling section 517 and execution section 519 when the monitored signals indicate a need to modify reconfigurable functional portion 512. When modification is needed, scheduling (WHEN) section 517 transmits scheduling signals to execution section 519, and, in accordance with an aspect of the second embodiment, selectively transmits a write enable (WE) signal to reconfigurable functional portion 512. In accordance with another aspect of the second embodiment, execution (HOW) section 519 generates modified configuration data on signal path 544-A that is written to a data input (DIN) terminal of configuration store (block RAM) 520 in accordance with write address signals transmitted on signal path 544-B. The configuration data is either stored during the initial configuration process, or written into configuration store 520 from configuration control portion 514. Configuration data read from configuration store 520 is transmitted to reconfigurable functional portion 512 on signal path 546.

Figure 6:
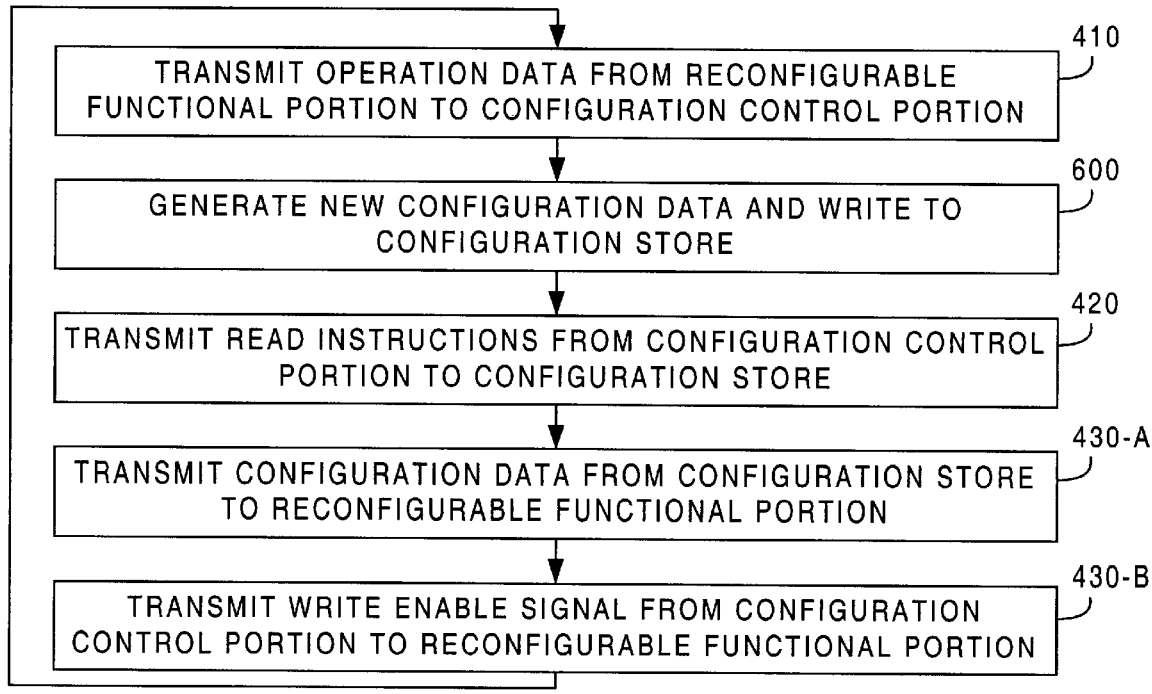
FIG. 6 is a flow diagram showing a method of operating the FPGA shown in FIG. 5 in accordance with a second embodiment of the present invention.

FIG. 6 is a flow diagram showing the basic steps utilized to perform the self-modification method according to the second embodiment of the present invention. Similar to the first embodiment, the self-modification process according to the second embodiment begins with operation data signals transmitted from reconfigurable functional portion 512 on signal path 542 that are monitored by monitor portion 515 of configuration control portion 514 (Step 410). Analysis portion 517 of configuration control portion 514 then analyzes the received signals, and initiates a reconfiguration process when the received signals indicate the need for modification of reconfigurable functional portion 512. In accordance with the second embodiment, this reconfiguration process includes an optional configuration data generation process (Step 600) during which execution portion 519 of configuration control portion 514 generates new configuration data. For example, if the self-modifying system is a filter, the new configuration data may be new filter parameters that are calculated in response to noise received by reconfigurable functional portion 512. After calculating the new configuration data, the new configuration data is written to configuration store 520 on signal path 544-A, and into memory locations determined by address signals transmitted on signal path 544-B. Appropriate write enable signals may be transmitted on additional signal paths (not shown). Next, the reconfiguration process includes transmitting read instructions (i.e., address signals and other read command signals) on signal paths 544-B from configuration control portion 514 to configuration store 520 (Step 420). The read instructions may address configuration data written to configuration store 520 from execution portion 519 of configuration control portion 514, or configuration data previously stored in configuration store 520 during the initial configuration process. In either case, the selected configuration data is transmitted on signal path 546 to reconfigurable functional portion 512 (Step 430-A). According to the second embodiment, an optional write enable signal is simultaneously transmitted from scheduling (WHEN) portion 517 of configuration control portion 514 to reconfigurable functional portion 512 on signal path 548, thereby causing the selected configuration data to be stored in reconfigurable functional portion 512 (Step 430-B).

Additional details of the first and second embodiments described above are provided below with reference to specific examples shown in FIGS. 7 through 10.

EXAMPLE 1

Figure 7:
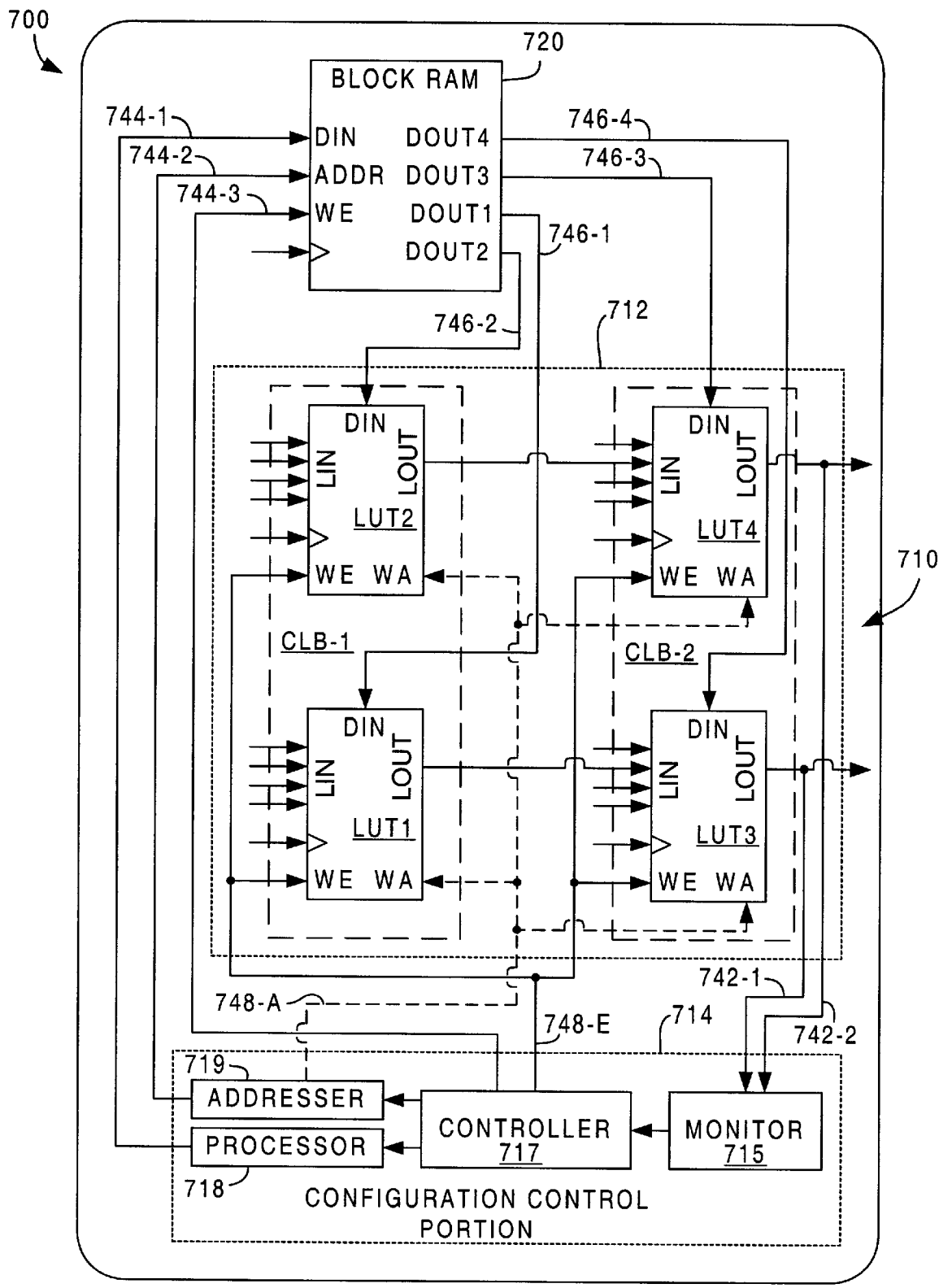
FIG. 7 is a simplified diagram illustrating a third configuration of user logic resources and interconnect resources of an FPGA in accordance with a third embodiment of the present invention.

FIG. 7 is a simplified diagram illustrating the user-programmable logic portion of a PLD 700 that is configured to implement a self-modifying circuit in which each port of the configuration store (in this case, a block RAM circuit) transmits configuration data to a corresponding lookup table (LUT), and all of the LUTs are controlled to write the parallel-transmitted configuration data by a common write enable signal generated by the configuration control portion during the reconfiguration process.

Similar to the first and second embodiments (described above), PLD 700 includes a CLB array 710 that includes CLB-1 and CLB-2 and a configuration control portion, a block RAM 720, and a system of user-programmable interconnect resources for providing signal paths between CLB array 710, block RAM 720, IOB-1, and IOB-2.

CLB array 710 is used in a manner similar to CLB array 310 of PLA 300 (discussed above), with CLB-1 and CLB-2 of CLB array 710 configured to implement a reconfigurable functional portion 712, and additional CLBs (not shown) configured to implement configuration control portion 714.

Referring to reconfigurable functional portion 712, each of CLB-1 and CLB-2 includes one or more LUTs and additional circuitry (not shown), such as flip-flops for registering operation data signals. In the present example, CLB-1 includes LUT1 and LUT2, and CLB-2 includes LUT3 and LUT4. Although each CLB includes two LUTs in the present example, each CLB may include one LUT, more than two LUTs, or other comparable logic circuitry that is used in place of the LUTs. According to well known technology, each LUT includes several memory cells, each memory cell being addressed by a unique set of logic input signals received on the logic data input (LIN) terminals. The data bit stored in a selected memory cell is transmitted from its logic data output (LOUT) terminal. The LOUT terminal of LUT1 is coupled through other CLB circuitry (not shown) and by a signal path to one of the LIN terminals of LUT3, and the LOUT terminal of LUT3 is coupled to the LIN terminal of LUT4, thereby indicating that CLB-1 and CLB-2 cooperate to generate the logic function implemented by reconfigurable functional portion 712.

Configuration control portion 714 includes a monitor portion 715, a controller portion 717, a processor portion 718, and an addresser portion 719. Monitor portion 715 receives operation data signals on signal paths 742-1 and 742-2 from the LOUT terminals of LUT3 and LUT4, respectively. Monitor portion 715 generates control signals that are passed to controller section 717 when the monitored signals indicate a need to modify reconfigurable functional portion 712. When modification is needed, controller section 717 transmits scheduling signals to processor section 718, and generates write enable signals on signal paths 744-3 and 748-E, which are respectively connected to the write enable (WE) terminal of block RAM 720, and to the WE terminals of LUT1 through LUT4. Processor section 718 generates modified configuration data on signal path 744-1 that is written to a data input (DIN) terminal of configuration store (block RAM) 720. Addresser portion 719 generates RAM address signals on signal path 744-2 that are applied to an address (ADDR) terminal of block RAM 720. In addition, addresser portion 719 generates optional LUT address signals on optional signal path 748-A that are applied to write address (WA) terminals of LUT1 through LUT4.

Block RAM 720 stores configuration data that is used to reconfigure (modify) reconfigurable functional portion 712. In particular, block RAM 720 is a multi-port RAM circuit that includes data output (DOUT) terminals DOUT1 through DOUT4. In accordance with a first aspect of the present example, each DOUT terminal DOUT1 through DOUT4 is respectively connected by signal paths 746-1 through 746-4 to the DIN terminals of LUT1 through LUT4. In addition, block RAM 720 includes a data input (DIN) terminal connected to signal path 744-1, an address (ADDR) terminal connected to signal path 744-2, a write enable (WE) terminal connected to signal path 744-3, and a clock input terminal that receives a clock signal on an associated signal path (not shown).

PLD 700 operates as follows. After an initial configuration process, operation data signals transmitted on signal paths 742-1 and 742-2 are monitored by monitor portion 715. When self-modification is needed, monitor portion 715 signals controller 717, which transmits control signals to processor portion 718 and/or addresser portion 719. The logic function performed by each of these circuits is determined by the overall logic function implemented in PLA 700, and is therefore not specified herein.

In accordance with another aspect of the first example, when controller portion 717 determines that configuration data previously stored in block RAM 720 can be used to reconfigure LUT1 through LUT4, then controller portion 717 controls addresser portion 719 to transmit address signals to block RAM 720, thereby causing block RAM 720 to transmit the stored configuration data on signal paths 746-1 through 746-4. In addition, controller portion 717 generates a write enable signal on signal path 748-E that is transmitted to the WE terminals of LUT1 through LUT4, thereby causing these LUTs to store the configuration data transmitted on signal paths 746-1 through 746-4. The configuration data bit stream transmitted from block RAM 720 can be stored in a serial manner in each LUT (e.g., when LUT1 through LUT4 support shift register operations), or in a parallel manner. When parallel data transmission is used, LUT address signals are transmitted from addresser portion 719 on signal path 748-A that address specific memory cells in each LUT to coordinate data storage.

In accordance with yet another aspect of the first example, when controller portion 717 determines that the configuration data stored in block RAM 720 cannot be used to reconfigure LUT1 through LUT4, appropriate control signals are generated that cause processor portion 718 to generate and transmit new configuration data to the DIN terminal of block RAM 720. This new configuration data transmission is coordinated with address signals transmitted on signal path 744-2 from addresser portion 719 and a write enable signal transmitted on signal path 744-3 from controller portion 717. After writing the new configuration data to block RAM 720, the new configuration data is then read from block RAM 720 using the process described above.

EXAMPLE 2

Figure 8:
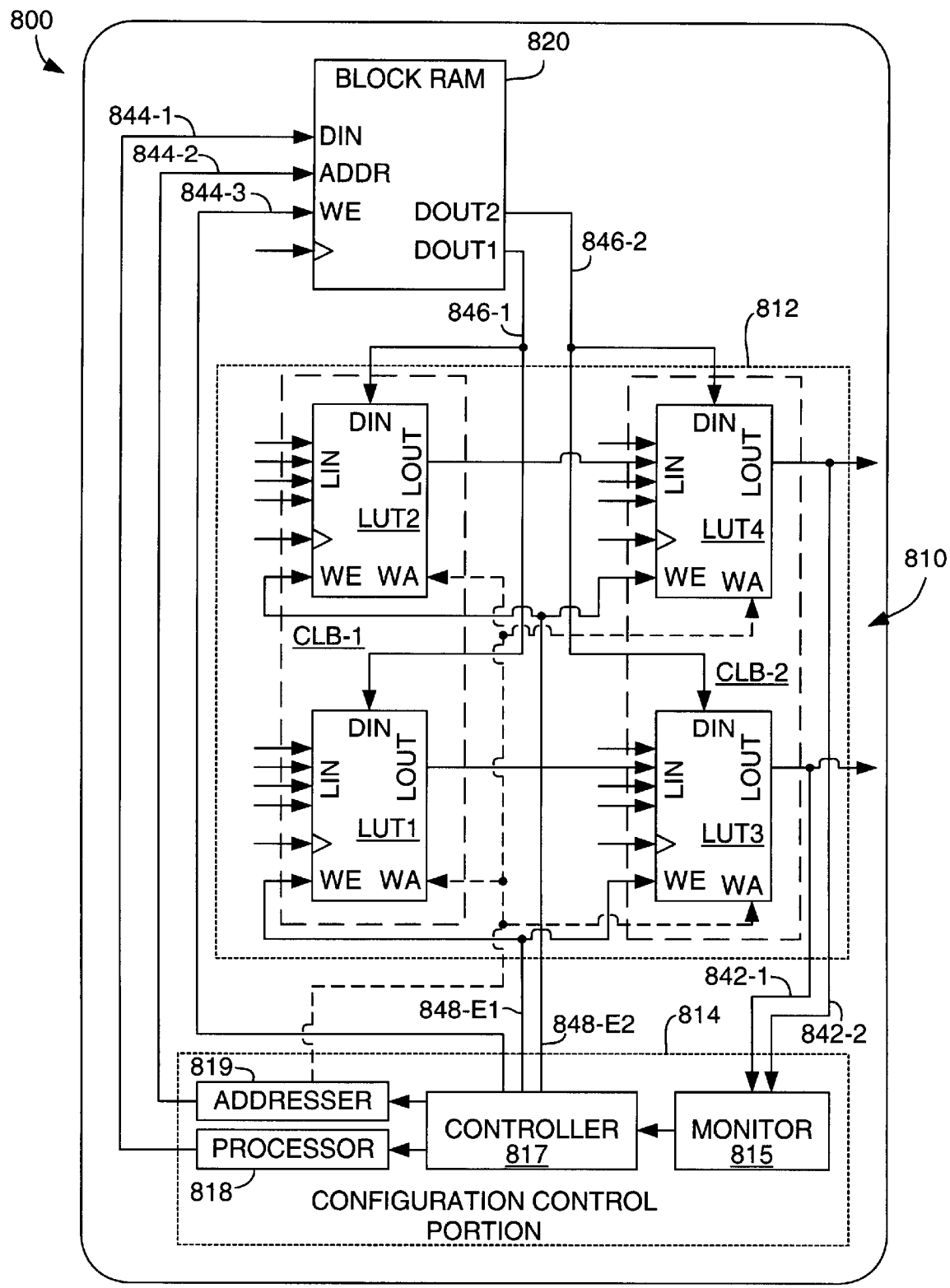
FIG. 8 is a simplified diagram illustrating a fourth configuration of user logic resources and interconnect resources of an FPGA in accordance with a fourth embodiment of the present invention.

FIG. 8 is a simplified diagram illustrating the user-programmable logic portion of a PLD 800 that is configured to implement a self-modifying circuit in which each port of the configuration store (in this case, a block RAM circuit) transmits configuration data to two or more LUTs, and the LUTs are controlled to store the transmitted configuration data in response to two or more write enable signals generated by the configuration control portion during the reconfiguration process.

Similar to PLD 700 (discussed above), PLD 800 includes a CLB array 810, a block RAM 820, and a system of user-programmable interconnect resources. CLB array 810 is configured to implement a reconfigurable functional portion 812 and configuration control portion 814 in a manner similar to that described above. Similar to configuration control portion 714 of PLD 700 (see FIG. 7), configuration control portion 814 includes a monitor portion 815, a controller portion 817, a processor portion 818, and an addresser portion 819.

In accordance with an aspect of the second example, controller 817 generates two write enable signals that are transmitted to the WE terminals of LUT1 through LUT4. Specifically, a first write enable signal is transmitted on signal path 848-E1 to the WE terminals of LUT1 and LUT3, and a second write enable signal is transmitted on signal path 848-E2 to the WE terminals of LUT2 and LUT4. Other control and address signals generated by configuration control portion 814 are similar to those described above with reference to configuration control portion 714 in the first example.

In accordance with another aspect of the second example, only two DOUT terminals (DOUT1 and DOUT2) of block RAM 820 are used to transmit configuration data to four LUTs (LUT1 through LUT4). In particular, terminal DOUT1 is connected to the DIN terminals of LUT1 and LUT2 via signal path 846-1, and terminal DOUT2 is connected to the DIN terminals of LUT3 and LUT4 via signal path 846-2.

PLD 800 operates as follows. After an initial configuration process, operation data signals transmitted on signal paths 842-1 and 842-2 are monitored by monitor portion 815. When self-modification is needed, monitor portion 815 signals controller 817, which transmits control signals to processor portion 818 and/or addresser portion 819.

When controller portion 817 determines that configuration data previously stored in block RAM 820 can be used to reconfigure LUT1 through LUT4, then controller portion 817 controls addresser portion 819 to transmit address signals to block RAM 820 in two cycles. During a first cycle, a first set of configuration data values is read from block RAM 820 and transmitted on signal paths 846-1 and 846-2. In addition, controller portion 817 generates a write enable signal on signal path 848-E1, thereby causing LUT1 and LUT3 to receive the first set of configuration data values (signal path 848-E2 is maintained at a voltage level that disables the write enable function of LUT2 and LUT4). Subsequently, during a second cycle, a second set of configuration data values is read from block RAM 820 and transmitted on signal paths 846-1 and 846-2. Also during the second cycle, controller portion 817 generates a write enable signal on signal path 848-E2, thereby causing LUT2 and LUT4 to receive the second set of configuration data values. Accordingly, reconfigurable functional portion 812 is reconfigured (modified) in multiple cycles using fewer DOUT terminals than are used in the first example (described above). This arrangement is beneficially used when block RAM 820 does not have enough DOUT terminals to transmit configuration data on separate signal paths to each LUT.

EXAMPLE 3

Figure 9:
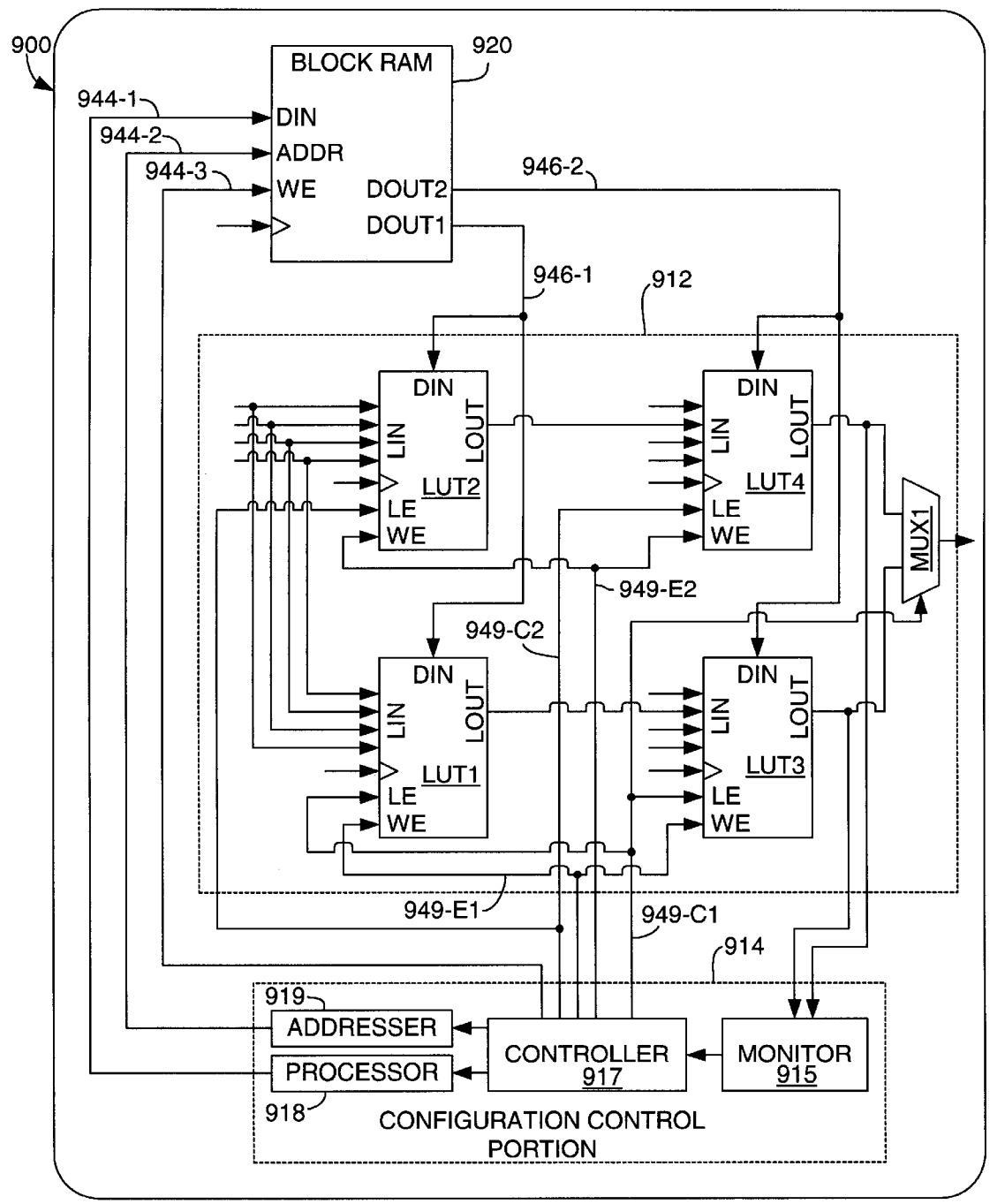
FIG. 9 is a simplified diagram illustrating a fifth configuration of user logic resources and interconnect resources of an FPGA in accordance with a fifth embodiment of the present invention.

FIG. 9 is a simplified diagram illustrating the user-programmable logic portion of a PLD 900 that is configured to implement a self-modifying circuit which, at the cost of programmable resources, includes duplicate logic (e.g., LUT) sections that are multiplexed by separate logic enable signals so that one set can operate while the other is being configured.

PLD 900 is similar to PLD 800 (discussed above), except that reconfigurable functional portion 912 includes duplicate logic sections, and configuration control portion 914 generates logic enable signals that selectively activate one of the two duplicate logic sections. Referring to FIG. 9, a first logic section is formed by LUT1 and LUT3, and a second logic section is formed by LUT2 and LUT4. The LIN terminals of LUT1 and LUT2 receive the same logic input signals, and connections (not shown) within each logic section are identical. The logic signals provided by the LOUT terminals of LUT3 and LUT4 are transmitted to input terminals of a multiplexer MUX1. In addition to transmitting write enable signals on signal paths 949-E1 and 949-E2, controller portion 917 generates logic enable signals on signal paths 949-C1 and 949-C2 that are transmitted to logic enable (LE) terminals of LUT1 through LUT4. Note that the logic enable signal on signal path 949-C1 is also transmitted to the select terminal of MUX1.

In accordance with an aspect of the third example, controller 917 generates two logic enable signals on signals paths 949-C1 and 949-C2 that selectively control reconfigurable functional portion 912 to operate in either a first operating mode or a second operating mode.

During the first operating mode, a logic enable signal is asserted on signal path 949-C1 that is transmitted to logic enable (LE) terminals of LUT1 and LUT3, thereby enabling the operation of the first logic section that includes these LUTs (the logic enable signal on signal path 949-C2 is de-asserted, thereby disabling the second logic section). The logic enable signal on signal path 949-C1 also controls MUX1 to pass the logic signal output from LUT3 during the first operating mode. The disabled second logic section may be reconfigured during the first operating mode using the techniques described above in the second example.

During the second operating mode, a logic enable signal is asserted on signal path 949-C2 that is transmitted to the LE terminals of LUT2 and LUT4, thereby enabling the operation of the second logic section that includes these LUTs. The logic enable signal on signal path 949-C1 is de-asserted during the second operating mode, thereby causing MUX1 to pass the logic signal output from LUT4. While disabled, the first logic section may be reconfigured using the techniques described above in the second example.

According to the third example shown in FIG. 9, reconfigurable functional portion 912 is reconfigured (modified) in multiple operating modes that allow uninterrupted operation of reconfigurable functional portion 912. Specifically, a unique output signal is transmitted from the output terminal of MUX1 that is generated by LUT3 during the first operating mode (e.g., while LUT2 and LUT4 are being reconfigured), and generated by LUT4 during the second operating mode (e.g., while LUT1 and LUT3 are being reconfigured).

EXAMPLE 4

Figure 10:
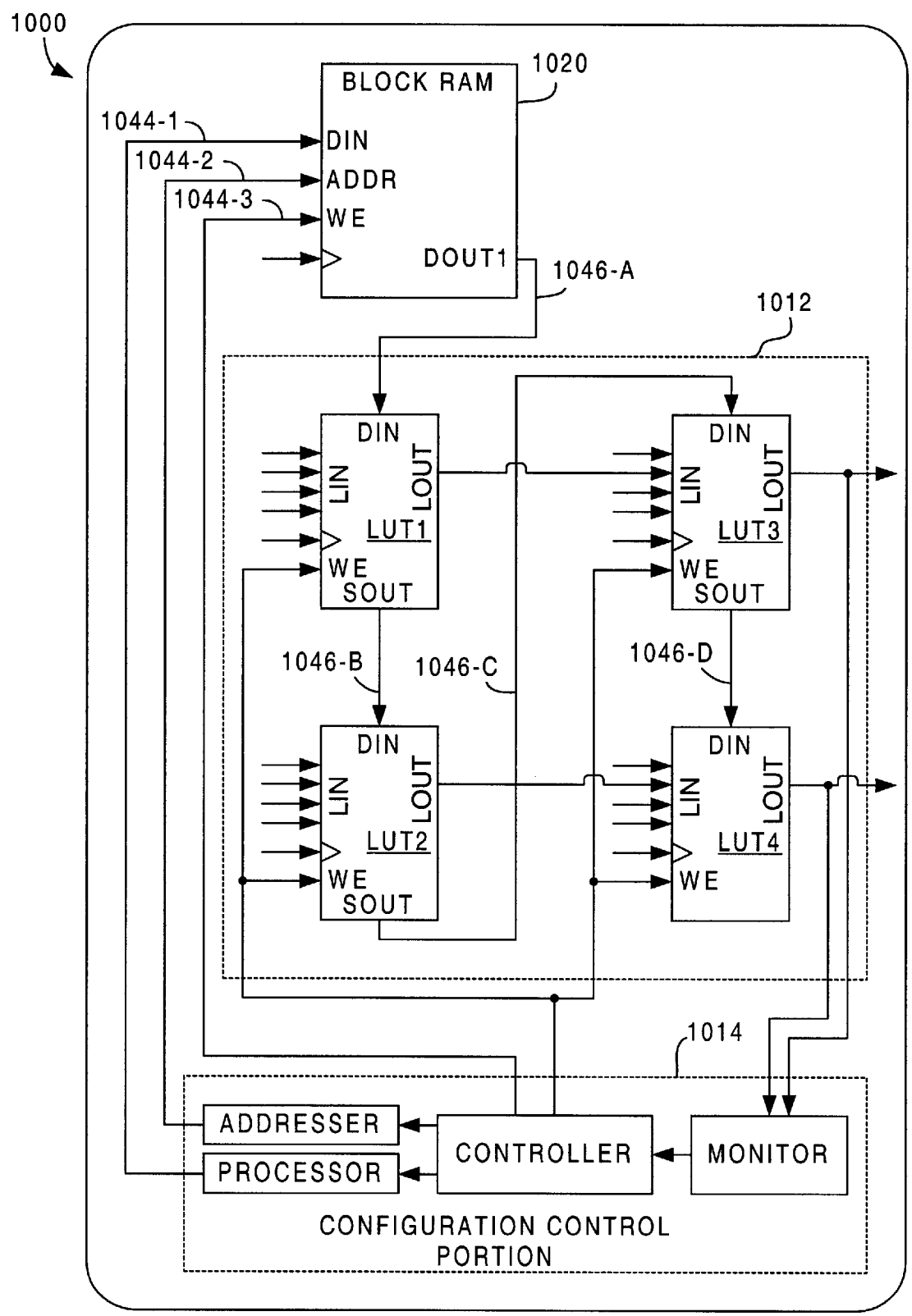
FIG. 10 is a simplified diagram illustrating a sixth configuration of user logic resources and interconnect resources of an FPGA in accordance with a sixth embodiment of the present invention.

FIG. 10 is a simplified diagram illustrating the user-programmable logic portion of a PLD 1000 that is configured to implement a self-modifying circuit in which configuration data is transmitted in a serial fashion to all LUTs implementing the reconfigurable functional portion of a PLD, thereby reducing the number of RAM DOUT terminals and interconnect resources at the cost of reconfiguration time.

PLD 1000 is configured in a manner similar to the first through third examples (discussed above), except that the LUTs are linked by a series of signal paths that are accessed during reconfiguration to shift configuration data to all LUTs of reconfigurable functional portion 1012. Referring to FIG. 10, the DOUT1 terminal of block RAM 1020 is connected by a first signal path 1046-A to the DIN terminal of LUT1. The shift-out (SOUT) terminal of LUT1 is connected by a second signal path 1046-B to the DIN terminal of LUT2. The SOUT terminal of LUT2 is connected by a third signal path 1046-C to the DIN terminal of LUT3. Finally, the SOUT terminal of LUT3 is connected by a fourth signal path 1046-D to the DIN terminal of LUT4.

During a reconfiguration process, configuration data is read from block RAM 1020 using the techniques described above, and is transmitted in a bit stream that is shifted through LUT1 through LUT4 using well known techniques. Accordingly, a minimal number of DOUT terminals of block RAM 1020 are used.

The above examples illustrate various implementations using the on-chip PLD self-modification method of the present invention. Those having skill in the relevant arts of the invention will now perceive various modifications and additions that may be made as a result of the disclosure herein. For example, the self-modification method may be utilized in FPGAs including volatile (e.g., SRAM) LUT-based logic elements and non-volatile (e.g., mask programmed, fuse or antifuse) interconnect resources. Accordingly, all such modifications and additions are deemed to be within the scope of the invention, which is to be limited only by the appended claims and their equivalents.

What is claimed is:

1. An on-chip method for self-modifying a programmable logic device (PLD), the PLD including a plurality of configurable logic blocks, a plurality of interconnect resources for selectively connecting the plurality of configurable logic blocks, and a memory circuit selectively connected to the interconnect resources, wherein the plurality of logic blocks are configured to implement a reconfigurable functional portion and a configuration control portion, wherein the reconfigurable functional portion is configured with first configuration data to perform an initial logic function, the method comprising:

transmitting operation data from the reconfigurable functional portion to the configuration control portion using a first group of the plurality of interconnect resources;

transmitting read instructions from the configuration control portion to the memory circuit using a second group of the plurality of interconnect resources; and transmitting second configuration data from the memory circuit to the reconfigurable functional portion using a third group of the plurality of interconnect resources in response to the read instructions, thereby modifying the reconfigurable functional portion to perform a secondary logic function in accordance with the second configuration data.

2. The on-chip self-modifying method according to claim 1, wherein transmitting operation data comprises transmitting input data signals from an input terminal of the reconfigurable functional portion.

3. The on-chip self-modifying method according to claim 1, wherein transmitting operation data comprises transmitting internally-generated data signals from intermediate portions of the reconfigurable functional portion.

4. The on-chip self-modifying method according to claim 1, wherein transmitting operation data comprises transmitting output data signals from an output terminal of the reconfigurable functional portion.

5. The on-chip self-modifying method according to claim 1, wherein transmitting read instructions comprises transmitting address signals that address selected configuration data stored in selected memory cells of the memory circuit, thereby causing the second configuration data to be transmitted on the second group of the plurality of interconnect resources.

6. The on-chip self-modifying method according to claim 1, wherein after transmitting the operation data and before transmitting the read instructions, the method further comprises generating the second configuration data in the configuration control portion, and then writing the second configuration data to the memory circuit using the second group of the plurality of interconnect resources.

7. The on-chip self-modifying method according to claim 6, wherein generating the second configuration data comprises:

monitoring the operation data and generating control signals when the monitored operation data indicates a need to modify the reconfigurable functional portion;

generating scheduling signals in response to the control signals; and transmitting the second configuration data to the memory circuit in response to the scheduling signals.

8. The on-chip self-modifying method according to claim 1, further comprising, during the transmission of the second configuration data from the memory circuit to the reconfigurable functional portion, transmitting a write enable signal from the configuration control portion to the reconfigurable functional portion on a fourth group of the plurality of interconnect resources.

9. The on-chip self-modifying method according to claim 1, wherein each of the plurality of configurable logic blocks includes a lookup table, wherein the second group of the plurality of interconnect resources includes:

a first signal path from a first output terminal of the memory circuit to a data input terminal of a first lookup table, and a second signal path from a second output terminal of the memory circuit to a data input terminal of a second lookup table, and wherein the transmission of second configuration data further comprises transmitting a first portion of the second configuration data to the first lookup table on the first signal path and a second portion of the second configuration data to the second lookup table on the second signal path.

10. The on-chip self-modifying method according to claim 9, further comprising, during the transmission of the second configuration data, transmitting a first write enable signal from the configuration control portion to the first and second lookup tables on a third signal path.

11. The on-chip self-modifying method according to claim 10, further comprising transmitting address enable signals from the configuration control portion to the first and second lookup tables on a fourth signal path.

12. The on-chip self-modifying method according to claim 9, further comprising, during the transmission of the second configuration data, transmitting a first write enable signal from the configuration control portion to the first lookup table on a third signal path, and transmitting a second write enable signal from the configuration control portion to the second lookup table on a fourth signal path.

13. The on-chip self-modifying method according to claim 12, further comprising transmitting address enable signals from the configuration control portion to the first and second lookup tables on a fourth signal path.

14. The on-chip self-modifying method according to claim 10, wherein the PLD further includes a third lookup table having a data input terminal connected to the first signal path, and a fourth lookup table having a data input terminal connected to the second signal path, the method further comprising, during the transmission of the second configuration data, selectively transmitting a second write enable signal from the configuration control portion to the third and fourth lookup tables on a fourth signal path.

15. The on-chip self-modifying method according to claim 1, wherein each of the plurality of configurable logic blocks includes a lookup table, wherein the second group of the plurality of interconnect resources includes:

a first signal path from an output terminal of the memory circuit to a data input terminal of a first lookup table, and a second signal path from an output terminal of the first lookup table to a data input terminal of a second lookup table, and wherein the transmission of second configuration data further comprises transmitting a portion of the second configuration data to the first lookup table on the first signal path, and to the second lookup table on the second signal path.

16. The on-chip self-modifying method according to claim 1, wherein each of the plurality of configurable logic blocks includes a lookup table, wherein the second group of the plurality of interconnect resources includes:
a first signal path from an output terminal of the memory circuit to a data input terminal of a first lookup table, and
a second signal path from an output terminal of the first lookup table to a data input terminal of a second lookup table, and
wherein the transmission of second configuration data further comprises transmitting a portion of the second configuration data to the second lookup table via the first signal path, the first lookup table, and the second signal path such that the portion of the second configuration data is shifted through the first lookup table.

17. A programmable logic device (PLD) including a plurality of configurable logic blocks, a plurality of interconnect resources for selectively connecting the plurality of configurable logic blocks, and a memory circuit selectively connected to the interconnect resources, wherein the plurality of configurable logic blocks and plurality of interconnect resources are configured to comprise:
a reconfigurable functional portion for performing an initial logic function in accordance with first configuration data;
a configuration control portion;
a first group of the plurality of interconnect resources forming a first signal path connected between the reconfigurable functional portion and the configuration control portion;
a second group of the plurality of interconnect resources forming a second signal path connected between the configuration control portion and the memory circuit; and
a third group of the plurality of interconnect resources forming a third signal path connected between the memory circuit and the reconfigurable functional portion;
wherein the configuration control portion includes means for monitoring operation data transmitted on the first signal path, and means for transmitting read instructions to the memory circuit using the second signal path when a self-modification event is detected, and
wherein the memory circuit transmits second configuration data to the reconfigurable functional portion on the third signal path in response to the read instructions, thereby modifying the reconfigurable functional portion to perform a secondary logic function in accordance with the second configuration data.

18. The programmable logic device according to claim 17,
wherein the first signal path is connected to an input terminal of the reconfigurable functional portion, and
wherein the configuration control portion monitors input data signals applied to the input terminal of the reconfigurable functional portion.

19. The programmable logic device according to claim 17,
wherein the first signal path is connected to an intermediate portion of the reconfigurable functional portion, and
wherein the configuration control portion monitors internally-generated data generated by the intermediate portion of the reconfigurable functional portion.

20. The programmable logic device according to claim 17,
wherein the first signal path is connected to an output terminal of the reconfigurable functional portion, and
wherein the configuration control portion monitors output data signals transmitted from the output terminal of the reconfigurable functional portion.

21. The programmable logic device according to claim 17, wherein the configuration control portion further comprises means for generating address signals that are transmitted in the read instructions to address selected configuration data stored in selected memory cells of the memory circuit, thereby causing the second configuration data to be transmitted on the second signal path.

22. The programmable logic device according to claim 17,
wherein the second group of the plurality of interconnect resources includes the second signal path connected between the configuration control portion and a data input terminal of the memory circuit, and a fourth signal path connected between the configuration control portion and an address input terminal of the memory circuit, and
wherein the configuration control portion further comprises means for generating the second configuration data, and for transmitting the second configuration data on the second signal path.

23. The programmable logic device according to claim 22,
wherein the means for monitoring operation data includes means for generating control signals when the monitored operation data indicates a need to modify the reconfigurable functional portion, and
wherein the means for generating the second configuration data comprises:
means for generating scheduling signals in response to the control signals, and
means for transmitting the second configuration data to the memory circuit in response to the scheduling signals.

24. The programmable logic device according to claim 17, further comprising a fourth group of the plurality of interconnect resources configured to form a fourth signal path connected between the configuration control portion and the reconfigurable functional portion,
wherein the configuration control portion includes means for transmitting a write enable signal to the reconfigurable functional portion on the fourth signal path during the transmission of the second configuration data from the memory circuit to the reconfigurable functional portion.

25. The programmable logic device according to claim 17,
wherein each of the plurality of configurable logic blocks includes a lookup table,
wherein the third group of the plurality of interconnect resources is configured to include:
the third signal path connected between a first output terminal of the memory circuit and a data input terminal of a first lookup table, and
a fourth signal path connected between a second output terminal of the memory circuit and a data input terminal of a second lookup table, and
wherein a first portion of the second configuration data is transmitted on the third signal path to the first lookup table, and a second portion of the second configuration data is transmitted on the fourth signal path to the second lookup table.

26. The programmable logic device according to claim 25, further comprising a fourth group of the plurality of interconnect resources configured to form a fifth signal path connected between the configuration control portion and the reconfigurable functional portion, wherein the configuration control portion includes means for transmitting a write enable signal to the first and second lookup tables on the fifth signal path during the transmission of the second configuration data from the memory circuit to the reconfigurable functional portion.

27. The programmable logic device according to claim 26, further comprising a fifth group of the plurality of interconnect resources configured to form a sixth signal path connected between the configuration control portion and the first and second lookup tables, and wherein the configuration control portion includes means for transmitting address enable signals from the configuration control portion to the first and second lookup tables on the sixth signal path.

28. The programmable logic device according to claim 25, further comprising:

a third lookup table having a data input terminal connected to the first signal path, and a fourth lookup table having a data input terminal connected to the fourth signal path; and a fourth group of the plurality of interconnect resources configured to form a fifth signal path and a sixth signal path each connected between the configuration control portion and the reconfigurable functional portion, wherein the configuration control portion includes means for transmitting, during the transmission of the second configuration data from the memory circuit to the reconfigurable functional portion, a first write enable signal to the first lookup table and the second lookup table on the fifth signal path, and a second write enable signal to the third lookup table and the fourth lookup table on the sixth signal path.

29. The programmable logic device according to claim 28, further comprising a fifth group of the plurality of interconnect resources configured to form a seventh signal path connected between the configuration control portion and the first, second, third, and fourth lookup tables, wherein the configuration control portion includes means for transmitting address enable signals to the first, second, third, and fourth lookup tables on the seventh signal path.

30. The programmable logic device according to claim 17, wherein each of the plurality of configurable logic blocks includes a lookup table, wherein the third group of the plurality of interconnect resources is configured to include:

the third signal path connected between an output terminal of the memory circuit and a data input terminal of a first lookup table, and a fourth signal path connected between an output terminal of the first lookup table and a data input terminal of a second lookup table, and wherein the transmission of second configuration data further comprises transmitting a portion of the second configuration data to the first lookup table on the third signal path, and to the second lookup table on the fourth signal path.

31. The programmable logic device according to claim 17, wherein each of the plurality of configurable logic blocks includes a lookup table, wherein the third group of the plurality of interconnect resources is configured to include:

the third signal path connected between an output terminal of the memory circuit and a data input terminal of a first lookup table, and a fourth signal path connected between an output terminal of the first lookup table and a data input terminal of a second lookup table, and wherein the transmission of second configuration data further comprises transmitting a portion of the second configuration data to the second lookup table via the third signal path, the first lookup table, and the fourth signal path such that the portion of the second configuration data is shifted through the first lookup table.

* * * * *